Aug. 14, 1956 A. A. MACDONALD ET AL 2,759,052

AMPLIFIER SEMI-CONDUCTOR VOLUME COMPRESSION SYSTEM

Filed Sept. 21, 1953

INVENTORS
ANGUS A. MACDONALD
ROBERT C. BALTEZORE
WILLIAM J. PARKS.

BY Foorman L. Mueller
ATTY.

United States Patent Office 2,759,052

Patented Aug. 14, 1956

2,759,052

AMPLIFIER SEMI-CONDUCTOR VOLUME COMPRESSION SYSTEM

Angus A. Macdonald, Hinsdale, and Robert C. Baltezore, Bellwood, Ill., and William J. Parks, Fort Wayne, Ind., assignors to Motorola, Inc., Chicago, Ill., a corporation of Illinois Application September 21, 1953, Serial No. 381,322

4 Claims. (Cl. 179—171)

This invention relates generally to audio frequency compression systems, and more particularly to systems for providing instantaneous deviation control in phase modulation systems by compressing the modulating signal applied thereto.

This invention is directed to an improvement in the system disclosed in Winkler Patent 2,572,900 wherein instantaneous deviation control is provided by compressing the audio signal applied to a phase modulation transmitter. This system has found wide commercial application and has been highly satisfactory in actual commercial use. Although limited distortion is produced in the compression of signals that would cause overmodulation of the transmitter, this has not been found to be objectionable, particularly in communication systems wherein speech transmission is principally used.

The present invention is directed to a simplified instantaneous compression circuit wherein a transistor is used, with the transistor providing both amplification and symmetrical clipping or limiting of the modulating wave. This results in a substantial over-all simplification of the circuit. Further, the use of a single transistor reduces materially the power requirements of the system and also the space and weight required, so that a very small lightweight low power unit is provided.

It is therefore an object of the present invention to provide an improved instantaneous deviation control system.

It is a further object of this invention to provide an extremely simple audio compression system which requires only a single transistor so that the system is very compact and lightweight, and requires very little power.

A feature of this invention is the provision of an instantaneous deviation control circuit wherein a single transistor provides amplification and symmetrical limiting of a differentiated signal so that the output thereof can be integrated to restore the signal, with the high-frequency high-amplitude components being compressed so that the deviation produced thereby is limited.

Another feature of this invention is the provision of a deviation control system for a phase modulation transmitter wherein the audio signal is first applied to a differentiator circuit, then to a transistor stage which amplifies the wave and limits both the positive and negative portions thereof, and then to an integrator which restores the audio signal with the sharp slopes being removed. The restored signal is then applied to a phase modulator for modulating a carrier wave which is thereafter amplified and transmitted.

Figure 1:
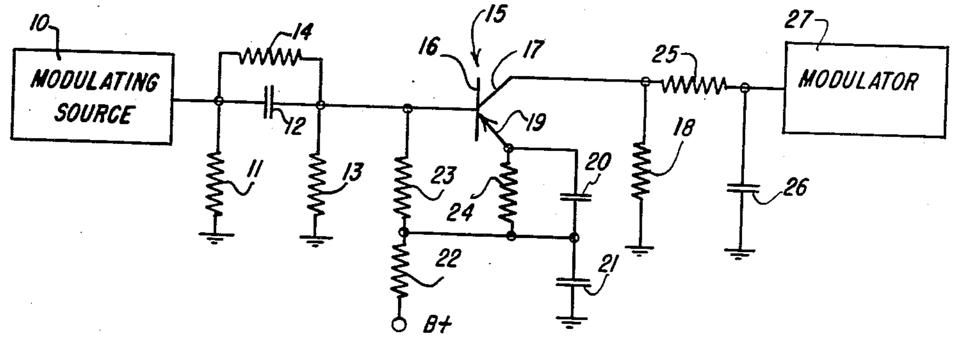
Figure 2:
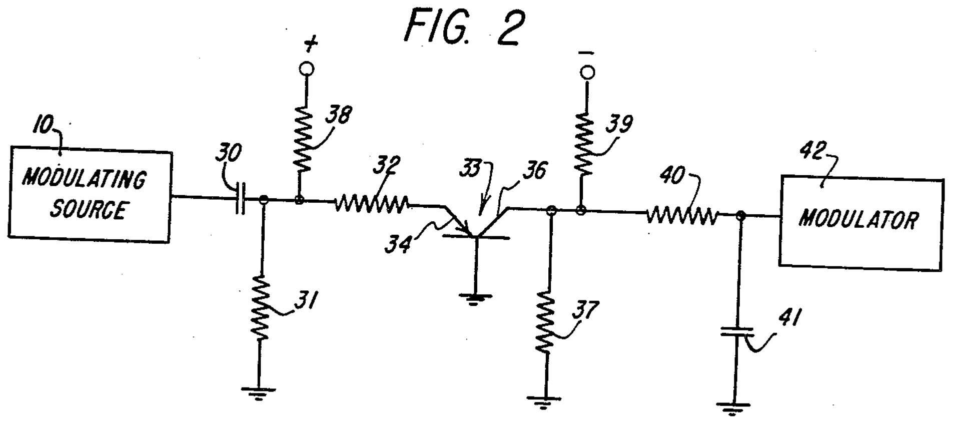

Further objects, features and the attending advantages of the invention will be apparent from a consideration of the following description when taken in connection with the accompanying drawings, in which:

Fig. 1 is a circuit diagram of a transmitter incorporating the audio compression system in accordance with the invention; and Fig. 2 is a circuit diagram of a second embodiment of the invention in which a transistor stage of different construction is used.

In practicing the invention there is provided a compression system for use in a phase modulation transmitter wherein the modulating signal is compressed to limit the deviation of the transmitter. The modulating signal may be an audio signal obtained from a microphone or other signal source, and a preamplifier may be used to increase the level thereof. The modulating signal is applied to a differentiating circuit which may be formed by a condenser and resistor in series, with the differentiated signal appearing across the resistor. The differentiated signal is applied to a transistor stage which amplifies the signal and also limits the same, with both the positive and negative portions of the waves being clipped symmetrically. The transistor stage may use circuits of various types, such as grounded emitter or grounded base circuits, and junction or point contact transistors of the PNP or NPN types may be used. The output of the transistor stage, which is the differentiated signal which has been amplified and limited, is applied to an integrating circuit which restores the modulating wave for values below the clipping level while compressing the steep slopes thereof. It is to be pointed out that modulating signals which are within predetermined limits as to frequency and amplitude are completely restored to their original form and only high-frequency high-amplitude signals are compressed. The restored signal from the integrator may be applied to a modulator for modulating a carrier wave to be transmitted in a well-known manner.

Referring now to the drawings, in Fig. 1 there is illustrated a system in accordance with the invention wherein a modulating signal is produced by a source 10. As previously stated, this may be an audio source such as a microphone, and may include one or more preamplifier stages which may be either of the transistor or vacuum tube type. The output from the modulating source is developed across resistor 11 as a voltage wave and applied to the differentiating circuit formed by condenser 12 and resistor 13. A resistor 14 is bridged across condenser 12 to decrease the signal reduction at low frequencies. The differentiating circuit acts to provide a voltage across resistor 13 which varies with the rate of change of the modulating signal.

The differentiated wave is applied from resistor 13 to the transistor stage 15. The signal is applied to the base electrode 16 of the transistor, and the output of the stage is derived from the collector electrode 17 and appears across resistor 18. The emitter electrode 19 is grounded for signal frequencies through condensers 20 and 21. The transistor stage amplifies the signal applied thereto so that the signal at the collector electrode 17 is of higher amplitude than the signal applied to the base electrode 16.

Operating bias is provided for the transistor 15 from the B+ source through resistor 22, with a positive potential being applied to the base electrode 16 from the voltage divider including resistor 23 and resistor 13. A positive bias is also applied to the emitter electrode 19 through the resistor 24. The biases applied to the electrodes of the transistor are adjusted with respect to the signal values applied to the stage so that clipping or limiting of the signal will take place when the signal exceeds a predetermined value. This limiting action is symmetrical and results in the excess amplitude being clipped off both the positive and negative portions of the wave applied to the transistor stage.

The output of the transistor stage is applied to the integrating circuit which is formed by the resistor 25 and the condenser 26. The voltage across condenser 26 therefore varies with the rate of change of the voltage applied to the integrating circuit. This voltage is applied to the modulator 27 which is of the phase modulation type. Accordingly, the modulating signal applied to the differentiating circuit will be restored, and in the event that the amplitude of the modulating signal is such that no limiting takes place, the restoration will be complete and there will be no change in the modulating signal. However, when the frequency and amplitude of the modulating signal exceed predetermined limits, the differentiated signal will be clipped in the transistor stage and will therefore be reduced. Accordingly, the high-frequency high-amplitude, or steep slope components, will be compressed and the signal will therefore be modified. As previously stated the low frequency response of the differentiating circuit is increased by the use of the resistor 14. This tends to compensate for the low frequency attentuation of the integrating circuit.

As has been fully pointed out in the aforementioned Winkler patent, the deviation of a phase modulation transmitter depends upon the frequency and amplitude of the modulating signal applied thereto. Accordingly, to prevent overmodulation of such a transmitter it is necessary that the modulating signal be held within certain limits as to frequency and amplitude. Since the differentiating circuit produces an output which varies with frequency and amplitude, by limiting both the positive and negative portions of the differentiated wave, a control can be achieved which is effective to control the deviation of the transmitter. Accordingly, the modulating signal, prior to application thereof to the modulator, is compressed by the system in accordance with the invention so that the high-frequency high-amplitude components are removed, and the modulating signal will therefore be held within such limits that the modulation resulting thereform will not cause over-modulation of the phase modulation transmitter. As the signal is compressed before modulation and all high-frequency high-amplitude components are removed, there is no time delay and for that reason the system is instantaneous. This is advantageous as compared to systems wherein a control operates from the signal requiring a time delay, as in such system the first high frequency components are passed and may cause temporary overmodulation of the transmitter.

In the system in accordance with the invention which has been tested and found satisfactory the following values have been used:

| | |
|---|---|
| Resistor 11 | 3,900 ohms. |
| Condenser 12 | .02 microfarad. |
| Resistor 13 | 3,000 ohms. |
| Resistor 14 | 10,000 ohms. |
| Transistor 15 | Type CK721. |
| Resistor 18 | 2,200 ohms. |
| B+ source | 85 volts. |
| Condenser 20 | 50 microfarads. |
| Condenser 21 | 10 microfarads. |
| Resistor 22 | 33,000 ohms. |
| Resistor 23 | 470 ohms. |
| Resistor 24 | 470 ohms. |
| Resistor 25 | 100,000 ohms. |
| Condenser 26 | .01 microfarad. |

The above values provide clipping at a level so that the voltage at the output of the system is .7 volt R. M. S. value.

The circuit described above has been found to be highly stable and to be relatively independent of changes in temperature and in changes in the characteristic of the transistor units used. The resistor 24 is made relatively large to provide degenerative action so that good temperature stabiliy is obtained, and the circuit is rendered relatively independent of the characteristics of the individual transistor unit. Resistor 23 is selected at a compromise value, it being desirable to make this resistor low to provide good stability, and to make this resistor high to provide a relatively high input impedance so that the condenser 12 may be held at a relatively low value. The resistor 18 must also be held at a compromise value as increasing this resistor raises the gain but adversely affects the temperature stability. Accordingly, this resistor is placed at intermediate value wherein good temperature stability is provided and reasonably good gain is produced in the transistor amplifier stage. The condenser 20 bridging the resistor 24 may be eliminated in the event that high gain in the stage is not required. Although the use of such a condenser reduces the degeneration and therefore increases the gain, the reduction of degeneration may cause an increase in distortion and in the effect of the use of different transistors in the circuit.

Although the circuit of Fig. 1 illustrates the use of a PNP type transistor connected in a grounded emitter type circuit, it is to be pointed out that various different types of transistor stages may be used in the system. In Fig. 2 there is illustrated a similar system using a transistor circuit of the grounded base type. Although this transistor is also of the PNP type, an NPN type transistor may be used by merely reversing the polarity of the bias potentials.

In Fig. 2 the modulating signal from the audio source 10 is applied to a differentiating circuit including the condenser 30 and the resistor 31. As stated above, the voltage across resistor 31 varies with the rate of change of the audio modulating signal. This voltage is applied through resistor 32 to the emitter electrode 34 of the transistor stage 33. The base electrode 35 of the transistor is connected to ground and the output is derived from the emitter electrode 36 with the output signal being developed across the resistor 37. Operating potential is applied to the transistor 33, with a positive potential being applied to the emitter electrode 34 through resistors 38 and 32, and a negative potential being applied to the collector electrode 36 through resistor 39. The transistor stage 33 amplifies the differentiated signal and symmetrically clips the same so that both the positive and negative portions of the signal are held within predetermined limits. The signal across resistor 37 is applied to the integrating circuit formed by resistor 40 and condenser 41. The original signal is reproduced, with the high-frequency high-amplitude components thereof compressed, across condenser 41 as has been previously described. This signal may be applied to a modulator 42.

As set forth with respect to Fig. 1 the integrating circuit formed by resistor 40 and condenser 41 will completely restore the modulating signal in the event that the level thereof is such that no limiting action takes place in the transistor stage. However, if the modulating signal includes components of high frequency and high amplitude, steep wave front components will be developed across resistor 31 of the differentiating circuit which are clipped in the transistor stage, and therefore these high-frequency high-amplitude components will be compressed and will not be reproduced in the original manner by the integrating circuit. Since such high-frequency high-amplitude components occur only occasionally in normal voice signals, and because audio signals are understandable without such components, the distortion resulting from the compression of the signal does not interfere substantially with the intelligibility of the signal applied to the system. However, the system will be effective to compress such signals so that overmodulation of the transmitter is not produced thereby.

It is therefore seen that an effective compression system has been provided for use with phase modulation transmitters which is formed by a very simple and inexpensive circuit. The transistor stage described, which provides amplification and also symmetrical clipping of the signal, results in a great simplification of the overall circuit. Because of the very small power requirements of transistor stages the power requirements of the circuit are reduced materially over prior vacuum tube circuits. The simplification of the circuit results in a very small compact unit which is particularly applicable for use in mobile transmitters wherein space and weight are at a great premium.

Although certain embodiments of the invention have been disclosed which are illustrative thereof, it is obvious that various changes and modifications can be made therein without departing from the intended scope of the invention as defined in the appended claims.

We claim:

1. In a phase moduation system in which a carrier wave is modulated by a modulating wave, the system for compressing the modulating wave including in combination, an input circuit for receiving the modulating wave including differentiating means for producing therefrom a second wave which varies with the rate of change of voltage of the modulating wave, a transistor stage coupled to said input circuit having a transistor element, output impedance means connected thereto, and means for providing operating potentials to said transistor element so related to said output impedance means that said stage amplifies and symmetrically limits the amplitude of the second wave to produce a third wave, and an output circuit coupled to said transistor stage including integrating means for producing an output wave the voltage of which changes at a rate varying with the amplitude of the third wave, to thereby restore the modulating wave with the high-frequency high-amplitude components thereof being compressed.

2. A system for compressing a low frequency wave including in combination, an input circuit for receiving the low frequency wave including differentiating means for producing therefrom a second wave which varies with the rate of change of voltage of the low frequency wave, a transistor stage including a transistor unit having base, emitter and collector electrodes, means coupling said input circuit to said base electrode, means connected to said emitter electrode providing a ground path for signal frequencies, an output circuit including impedance means connected to said collector electrode, and means providing operating potentials to said electrodes so related to said impedance means that said transistor stage amplifies and symmetrically limits the amplitude of said second wave to produce a third wave, said output circuit including integrating means for producing an output wave the voltage of which changes at a rate varying with the amplitude of the third wave to restore the low frequency wave and to compress the high-frequency high-amplitude components thereof.

3. A combined amplifying and limiting transistor stage including a transistor unit having base, emitter and collector electrodes, an input circuit coupled to said base electrode, means having resistance connecting said emitter electrode to ground to provide degenerative action in said transistor stage, means providing operating potentials to said electrodes so that said transistor stage amplifies and symmetrically limits the amplitude of said second wave to produce a third wave, and an output circuit connected to said collector electrode, said output circuit having an impedance the value of which controls the level of the third wave.

4. A system for compressing an audio frequency wave including in combination, an input circuit for receiving the audio wave including differentiating means for producing therefrom a second wave which varies with the rate of change of voltage of the audio wave, a transistor stage including a transistor unit having base, emitter and collector electrodes, means coupling said input circuit to said emitter electrode, means connected to said base electrode providing a ground path for signal frequencies, an output circuit including impedance means connected to said collector electrode, and means providing operating potentials to said electrodes so related to said impedance means that said transistor stage amplifies and symmetrically limits the amplitude of said second wave to produce a third wave, said output circuit including integrating means for producing an output wave the voltage of which changes at a rate varying with the amplitude of the third wave to restore the audio wave and to compress the high-frequency high-amplitude components thereof.

References Cited in the file of this patent

UNITED STATES PATENTS

| | | |
|---|---|---|
| 2,295,323 | Armstrong | Sept. 8, 1942 |
| 2,398,596 | Price | Apr. 16, 1946 |
| 2,572,900 | Winkler | Oct. 30, 1951 |
| 2,652,460 | Wallace | Sept. 15, 1953 |